United States Patent [19]

Spapens

[11] 4,361,861
[45] Nov. 30, 1982

[54] APPARATUS HOUSING COMPRISING A NUMBER OF PARALLEL COMPONENT BOARDS

[75] Inventor: Harald H. C. M. Spapens, Eindhoven, Netherlands

[73] Assignee: U.S. Philips Corporation, New York, N.Y.

[21] Appl. No.: 184,842

[22] Filed: Sep. 8, 1980

[30] Foreign Application Priority Data

Sep. 14, 1979 [NL] Netherlands ............... 7906862

[51] Int. Cl.³ .............................................. H05K 7/20
[52] U.S. Cl. ................................. 361/391; 211/41; 361/383; 361/415
[58] Field of Search ............ 211/41, 50; 339/176 MP, 339/17 L, 17 C, 17 LC, 17 LM, 17 M, 17 N; 361/415, 390, 392–395, 399, 380–383, 391

[56] References Cited

U.S. PATENT DOCUMENTS

| | | | |
|---|---|---|---|
| 2,864,977 | 12/1958 | Witt | 361/395 |
| 2,945,989 | 7/1960 | Vogel | 361/395 |
| 3,245,546 | 4/1966 | Stuhler | 361/415 |
| 3,303,394 | 2/1967 | Peter | 361/415 |
| 3,310,710 | 3/1967 | Joachim | 361/415 |
| 3,662,224 | 5/1972 | Rauch | 361/395 |
| 4,227,237 | 10/1980 | Matthews | 361/415 |

FOREIGN PATENT DOCUMENTS

| | | |
|---|---|---|
| 1051335 | 9/1959 | Fed. Rep. of Germany . |
| 2317855 | 2/1977 | France . |

*Primary Examiner*—Gerald P. Tolin
*Attorney, Agent, or Firm*—David R. Treacy

[57] ABSTRACT

The invention relates to an apparatus housing, comprising a first wall (1) and a second wall (2) which are interconnected by means of side walls (3, 4) and wherebetween a number of parallel component boards (5) are detachably arranged, transversely of the first wall (1) and the second wall (2). Each of the component boards (5) is detachably connected, by way of an edge, to a third wall (8) of the housing which is arranged transversely of the side walls (3, 4) and the first wall (1) and the second wall (2). At their edge which is remote from the connection, the component boards (5) are provided with a guide bracket (12) whereby they are located in the housing. The guide brackets (12) are clamped onto the component boards (5) and serve as spacers between these boards (5) and the walls (1, 2, 3, 4) of the apparatus housing. The boards (5) can thus be simply slid into and out of the apparatus housing which may have a comparatively light and inexpensive construction, because only few and light components are required for the locating of the component boards (5).

4 Claims, 3 Drawing Figures

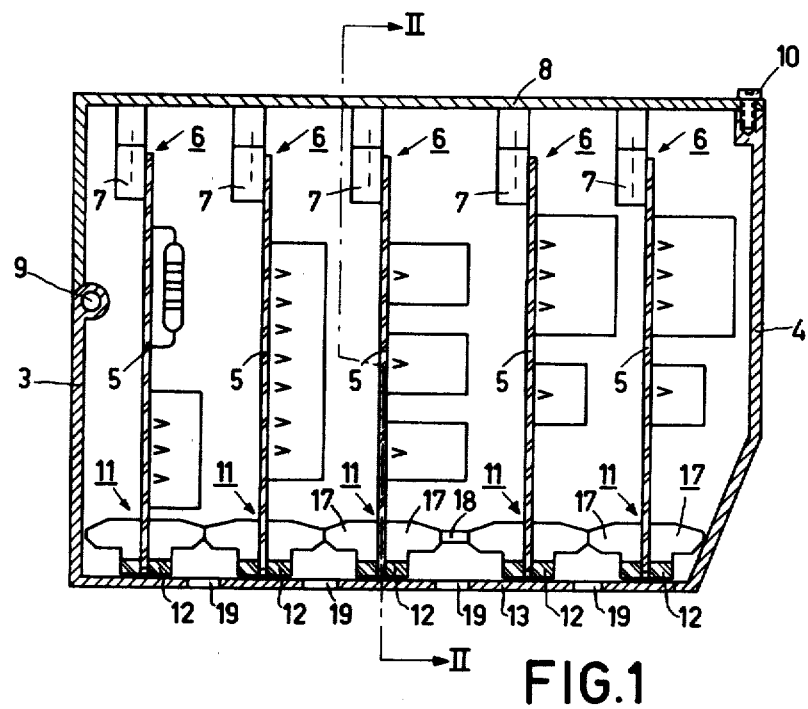
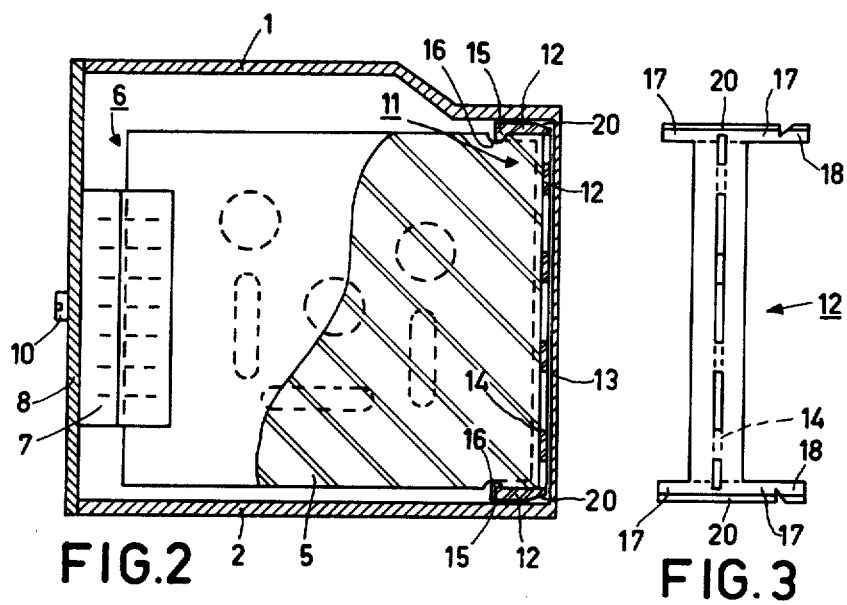
FIG.1 FIG.2 FIG.3

APPARATUS HOUSING COMPRISING A NUMBER OF PARALLEL COMPONENT BOARDS

The invention relates to an apparatus housing, comprising a first wall and a second wall which are interconnected by means of side walls and between which a number of parallel component boards are detachably arranged, transversely of the first and the second wall, each of said boards being detachably connected, by way of an edge, to a third wall of the housing which is arranged transversely of the side walls and the first and the second wall, the edge of each component board which is remote from the connection being provided with a guide bracket whereby the boards are located in the housing. An apparatus housing of this kind a particularly suitable for accommodating electronic circuits.

From French Patent application No. 75 21374 an apparatus housing of the described kind is known in which the guide brackets are secured to a side of the component boards by means of screws. These guide brackets comprise legs which extend in the direction of the connection of the component boards to the third wall and which are pressed against the first and the second wall by means of springs. Furthermore, the legs comprise recesses which mate with cams on the first and the second wall. The guide brackets secure the component boards in the apparatus housing with a clamp fit.

It is a drawback of the known apparatus housing that the component boards are secured therein with a clamp fit. Such a fit not only makes it difficult to remove a single component board, but the simultaneous removal of a number of boards from the apparatus housing is virtually impossible. For example, it may be very practical to remove a number of boards from the apparatus housing simultaneously with the wall whereto they are connected, for example, by means of plug-type connectors.

The invention has for its object to mitigate this drawback. To this end, an apparatus housing in accordance with the invention is characterized in that each of the guide brackets is provided with a groove in which one of the component boards is accommodated and with clamping cams which mate with recesses in the component boards, the guide brackets being proportioned so that they serve as spacers between the component boards and the first wall and the second wall as well as between the component boards themselves and the side walls.

The guide brackets can be simply clamped onto the component boards; this is a light and simple connection in comparison with a screwed connection. Furthermore, because the guide brackets serve merely as spacers, no spring is required for pressing parts of the guide brackets against the walls of the apparatus housing and the component boards can be readily slid into and out of the apparatus housing. Therefore, a number of boards can also be simultaneously removed from the apparatus housing together with the wall whereto they are connected, for example, by means of plug-type connectors. The guide brackets which serve merely as spacers between the component boards and the walls of the housing and between the component boards themselves, moreover, may have a very light construction. Because only few and light parts are required for accommodating the component boards in the housing the construction of the housing may be comparatively inexpensive and light.

In order to ensure that the air circulation inside the housing is obstructed as little as possible by the guide brackets, a preferred embodiment of an apparatus housing in accordance with the invention is characterized in that the guide brackets are smaller than the distance between the component boards viewed in the direction transversely of the component boards, the guide brackets being provided with spacer cams near the side edges of the component boards.

The invention will be described in detail hereinafter, by way of example, with reference to the accompanying diagrammatic drawing.

FIG. 1 is a cross-sectional view of an apparatus housing in accordance with the invention, FIG. 2 is a sectional view taken along the line II—II in FIG. 1, and FIG. 3 is a rear view of guide bracket as shown in the FIGS. 1 and 2.

The FIGS. 1 and 2 show an apparatus housing, which comprises a first wall 1 and a second wall 2 which are interconnected by side walls 3 and 4. A number of parallel component boards 5 are arranged transversely between the walls 1 and 2. The component boards 5 are detachably connected to a third wall 8 by plug-type connectors 7 (only diagrammatically shown) by way of one of their edges 6. The wall 8 is pivotably connected to the side wall 3 by a hinge 9 and is secured to the side wall 4 by a bolt 10. The housing may be opened by pivoting the wall 8 around the hinge 9 after loosening of the bolt 10. The component boards 5 can then be removed from the housing for repair or exchange. The component boards 5 are provided with guide brackets 12 on their opposite edge 11 to locate them in the housing. The guide brackets 12 serve merely as spacers between the component boards 5 and the first wall 1, the second wall 2, the wall 13, and the side walls 3 and 4 of the housing, and between the component boards 5 themselves. The guide brackets 12 may be made of a very light material, preferably a smooth, resilient synthetic material such as nylon.

The guide brackets 12, shown in a rear view in FIG. 3, comprise a groove 14 in which the component board 5 is accommodated and clamping cams 15 whereby they are very simply clamped into a recess 16 at the upper and the lower side of the component boards 5. Furthermore, viewed in the direction transversely of the component boards 5, the guide brackets 12 are smaller than the distance between the component boards 5, and near the side edges of the component boards 5 they are provided with spacer cams 17. These spacer cams 17 have extension cams 18 which can be broken off so that, the same guide brackets 12 can be used if the boards 5 are to be arranged at different mutual distances in the housing. It is merely necessary to break off the extension cams 18 from a number of brackets. Because the guide brackets 12 are comparatively narrow and bear one against the other only by way of the spacer cams 17, the guide brackets 12 do not impede the circulation of air in the apparatus housing by way of cooling apertures 19 provided in the wall 13 as shown in FIG. 1. Moreover, by using these guide brackets 12, component boards 5 can be readily pulled out of the set of component boards 5 connected to the wall 8 when the wall 8 is swung out. In order to facilitate withdrawal, the spacer cams 17 are provided with a knurled pattern (not shown) on their sides facing the lower wall 2 and the upper wall 1.

In order to facilitate the pivoting of the set of component boards 5 connected to the wall 8 into the housing, the guide brackets 12 comprise search edges 20 near the corners of the component boards.

What is claimed is:

1. An apparatus of the type having a plurality of electrical component boards in a housing, comprising
   a plurality of component boards, each board having first and second edges, a third edge extending between said first and second edges, a fourth edge opposite said third edge, and an electrical connector disposed along said third edge,
   a housing having first and second walls opposite each other, a third wall extending between said first and second walls, and a respective plurality of electrial connectors arranged along said third wall,
   each of said boards having the connector along its third edge detachably connected to a respective connector along the housing third wall, the first and second edges of said boards being free of guiding connection to said housing, and
   a respective plurality of guide brackets, each bracket having a groove into which a fourth edge of a component board is received, clamping means for releasably retaining each bracket on the respective board, and spacer cams extending from the bracket generally perpendicular to the component board, each cam having a free end, said cams being so arranged that free ends of cams from adjoining brackets abut each other so as to space the respective components boards in a predetermined relationship, space between cams extending in a same direction from a bracket allowing free flow of air between the adjoining brackets.

2. An apparatus as claimed in claim 1, characterized in that said housing further comprises side walls extending between said first and second walls, and said brackets serve as spacers between the boards and the side walls as well as the first and second walls.

3. An apparatus as claimed in claim 2, characterized in that said clamping means consists of at least one clamping cam on each bracket arranged to engage a respective recess in the respective component board.

4. An apparatus as claimed in claim 2, characterized in that the guide brackets include a search edge disposed near corners of the component boards.

* * * * *